United States Patent [19]
Clayton

[11] Patent Number: 4,727,513
[45] Date of Patent: * Feb. 23, 1988

[54] SIGNAL IN-LINE MEMORY MODULE

[75] Inventor: James E. Clayton, Londonderry, N.H.

[73] Assignee: Wang Laboratories, Inc., Lowell, Mass.

[*] Notice: The portion of the term of this patent subsequent to Apr. 7, 2004 has been disclaimed.

[21] Appl. No.: 16,704

[22] Filed: Feb. 20, 1987

Related U.S. Application Data

[63] Continuation of Ser. No. 873,879, Jun. 12, 1986, Pat. No. 4,656,605, which is a continuation of Ser. No. 528,817, Sep. 2, 1983, abandoned.

[51] Int. Cl.⁴ ............................................. G11C 13/00
[52] U.S. Cl. ...................................... 365/52; 365/189; 357/72
[58] Field of Search ................. 365/52, 189, 200, 202; 357/72, 75

[56] References Cited

U.S. PATENT DOCUMENTS

| | | | |
|---|---|---|---|
| 3,599,146 | 8/1971 | Weisbecker | 365/200 |
| 3,972,033 | 7/1976 | Cislaghi | 365/200 |
| 4,656,605 | 4/1987 | Clayton | 365/52 |

Primary Examiner—Terrell W. Fears
Attorney, Agent, or Firm—Michael H. Shanahan; Kenneth L. Milik

[57] ABSTRACT

What is disclosed is a memory module to and from which multibit binary words are stored and read out. Each multibit binary word comprises a standard byte size and one or more other memory bits that may be used for purposes such as parity checking. The modules may be mounted on a printed circuit mother board from which power, control signals and binary words are applied to and taken from the module.

2 Claims, 2 Drawing Figures 4,727,513

SIGNAL IN-LINE MEMORY MODULE

This is a continuation of copending application Ser. No. 873,879, filed on June 12, 1986, now U.S. Pat. No. 4,656,605, which is a continuation of Ser. No. 528,817, filed On Sept. 2, 1983, now abandoned.

BACKGROUND OF THE INVENTION

This invention relates to memories and more particularly to modular memories providing storage and retrieval of binary words.

SUMARY OF THE INVENTION

The present invention is a memory modular on which a plurality of memory components each storing or reading one binary bit at a time have their power, control, input/output and other access leads interconnected so there is only one set of these leads available at terminals of the module. A first plurality of these memories provide for one binary word being input or output to the memory module at a time. In addition, I add another individual memory intended for purposes such as parity checking and error correction. This additional memory has its power and control leads interconnected with the other memories within the module, but has separate input/output lead(s) and column address select leads to enable independent accessing or addressing of the parity memory.

DESCRIPTION OF THE DRAWING

My invention will be understood on reading the following detailed description in conjunction with the drawing in which.

DETAILED DESCRIPTION

Figure 1:
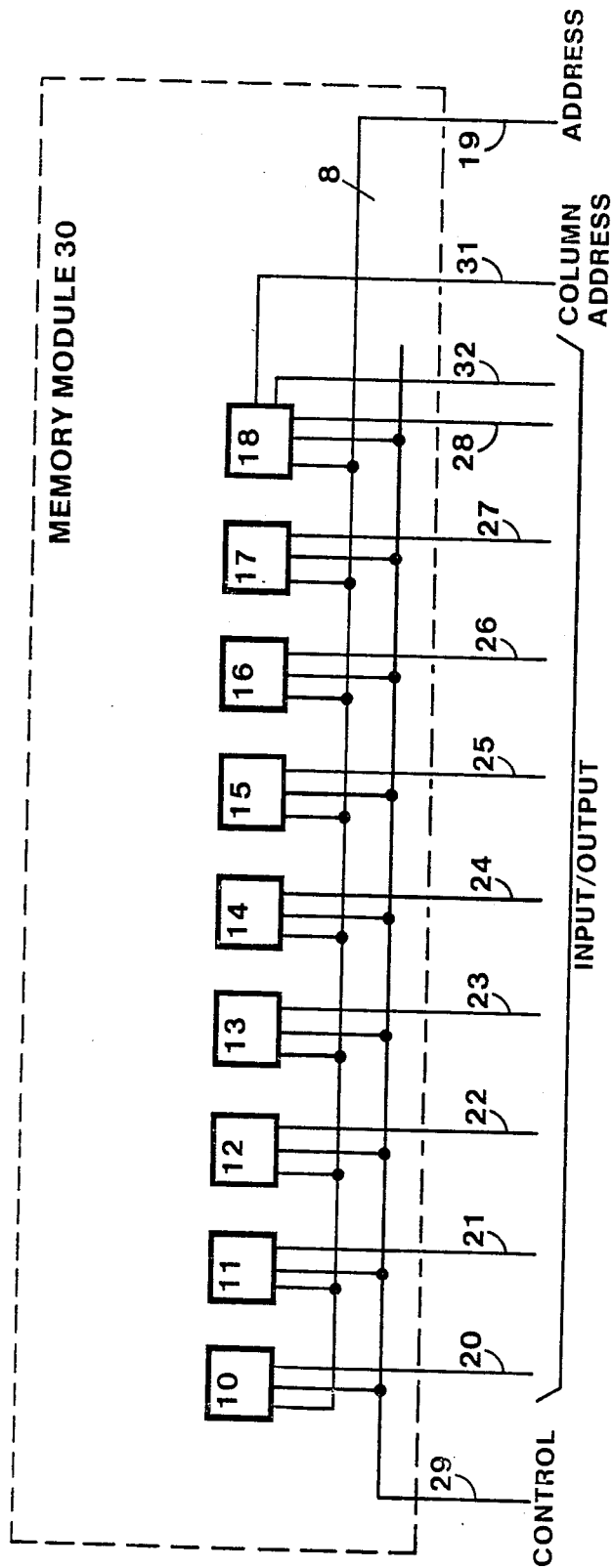
FIG. 1 is an electrical block diagram of my novel memory module.

In FIG. 1 is seen the electrical block diagram of my invention. In one embodiment of my invention, the embodiment shown in FIG. 1, eight individual memory chips 10-17, each capable of storing a zero or a one binary bit at each memory location, are accessed by a multi-bit address applied to address leads 19 which comprises eight leads. With this embodiment of my invention, single input/output leads 20-27 are provided respectively to each of memory chips 10-17 to provide a total of eight input/output leads making up an eight bit binary word. Control lead 29 connected to one input of each of memory chips 10-17 on the module 30 indicates whether a read or write operation is be performed at the location identified by the address present on the eight address leads 19 which are interconnected to the addressing inputs on each of chips 10-17.

In a manner well known in the art the concurrent addressing and control of chips 10-17 which are connected in parallel permits an eight bit byte or binary word to be store in or read out of memory chips 10-17 for each read or write operation.

In accordance with the preferred embodiment of my invention I provide an extra memory chip 18 similarly connected in parallel with memory chips 10-17, the read/write control leads of which are interconnected with the control leads 29 connected to memory chips 10-17 with the exception of the column address select lead 31. Memory chips 18 has a data input lead 28 and a separate data output lead 32 as distinguished from memory chips 10-17 which respectively use common input/output data leads 20-27 for both data input and output. A total of ten input/output data leads 20-28 and 32 are therefore provided on the edge of the memory module 30 as shown and eight bit binary words plus extra ninth bit for functions such as parity checking are stored in or read out of the memory module 30. A separate column address select lead 31 is provided for memory chip 18 to enable independent operation for the parity function.

When it is desired to store a binary word made up of a eight bit byte/word with a ninth parity bit in a specific address location in memory chips 10-17 and 18, the binary bits are applied to terminals on the edge of memory module 30 which are connected to common input/output leads 20-27 and to input lead 28. Each of the nine binary bits is thereby applied to the input respectively of memory chips 10-18. A signal is then applied to control lead 29 at a terminal on the edge of memory module 30, which control lead 29 is connected to the read/write control input chips 10-18. Finally, a multibit binary address is applied to the multiple address leads 19 also on the edge of memory module 30, which addressing leads are connected to the addressing inputs of each of memory chips 10-18. In response to all the above signals applied to the appropriate terminals of memory mudule 30, the binary word on input/output leads 20-27 and the extra binary bit on input lead 28 are stored respectively in memory chips 10-17 and 18 at the address indicated by the binary number on address leads 19.

Similarly, when it is desired to read a binary word out of memory module 30, a read signal is applied to read/write control lead 29 and a binary address is applied to address leads 19. In response thereto, the binary word stored in memory module 30 at the indicated address is read out of memory chips 10-17 and 18 respectively onto input/output leads 20-27 and output lead 32.

Figure 2:
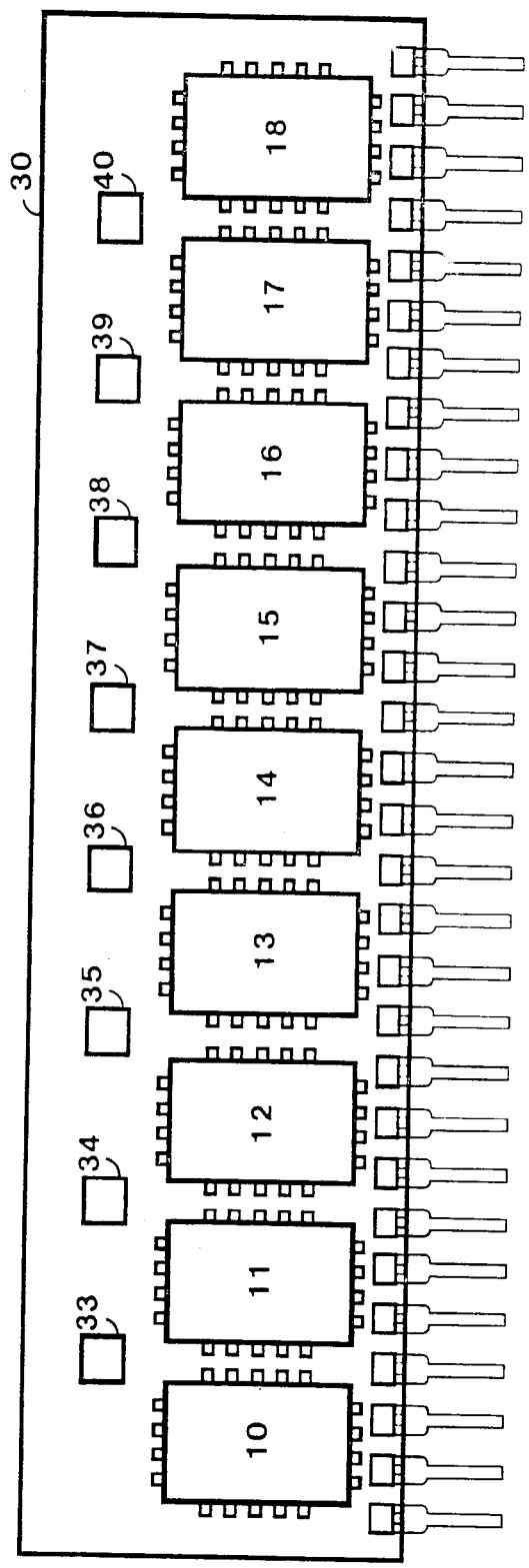
FIG. 2 is a mechanical layout drawing of the memory module.

Referring to FIG. 2, there is shown a physical layout of my memory module 30. The nine memory chips 10-18 are mounted on a substrate 31 that may be a printed circuit board or ceramic. The memory chips 10-18 may be dynamic RAMs (D-RAM) advantageously packaged in small plastic leaded chip carriers available from Texas Instruments and soon from other companies such as National Semiconductor, Motorola, and AMD. Also mounted on the substrate of module 30 are small ceramic decoupling capacitors 33-40, having the value between 0.1 and 0.22 ufd, and connected between each of memory chips 10-18 to suppress transient voltage spikes. By using the small D-RAMs and small capacitors, module 30 may have physical dimensions in the order of three-fourths inch by three inches while providing large memory capacity. Sixty-four thousand words on the module are presently possible and two hundred fifty-six thousand bytes are feasible with the physical dimensions of module 30 only being slightly larger.

With my invention the input, output and control of the memory elements 10-18 on module 30 may be accomplished via only thirty terminals on the edge of the module. Use of module 30 in lieu of memory chips in conventional dual in line terminal packages normally mounted in rows and columns on a printed circuit board enables an eight-fold density increase over previous circuit assembly technology, In addition, by having an extra memory chip parity may be checked. By having separate control of the extra memory chip a system designer has more flexibility in designing parity operation.

While what has been described hereinabove is the preferred embodiment of my invention, it will be obvious to those skilled in the art that numerous changes may be made without departing from the spirit or scope of the invention. More than one bit may be used for parity checking or other purposes. In addition, rather than using discrete memory chips, the unpackaged dies may be mounted on a substrate to implement my invention in a hybrid integrated circuit package or in a large scale integrated circuit package.

What I claim is:

1. A memory module for installation on a printed circuit motherboard comprising nine data memory chips for storing digital data, each having a data input and output, control input, and an address input, and each being packaged in a plastic leaded chip carrier, wherein said ninth memory chip is for storing detection and correction information associated with the eight data memory chips, an expoxy-glass printed circuit board substrate having a length and width adequate for mounting thereon only in a single row said nine memory chips and for interconnecting the control inputs and the address inputs of the memory chips so that bytes of digital information may be input to or output from the memory chips, the substrate including thirty terminals for providing access to the data inputs and outputs, control inputs, and address inputs of the nine memory chips and to enable reading and writing of information into and out of the nine chips, support means for supporting the memory module at an angle with respect to a motherboard and decoupling capacitors mounted on said substrate and coupled to the memory chips for suppressing transient voltages.

2. The module of claim 1 wherein all nine memory chips are interconnected such that data is input to or output from the ninth memory chips when data is input to or output from the other eight memory chips.

* * * * *